United States Patent
Walker et al.

(10) Patent No.: US 8,274,278 B1
(45) Date of Patent: Sep. 25, 2012

(54) NONCONTACT ANHYSTERIC CURVE PLOTTER AND STATIC FIELD TO TIME-VARYING HYSTERESISGRAPH WITH INTEGRATED TEMPERATURE CHAMBER

(75) Inventors: Jeremy Walker, Delray Beach, FL (US); Stephen E Saddow, Tampa, FL (US)

(73) Assignee: University of South Florida, Tampa, FL (US)

( * ) Notice: Subject to any disclaimer, the term of this patent is extended or adjusted under 35 U.S.C. 154(b) by 369 days.

(21) Appl. No.: 12/635,012

(22) Filed: Dec. 10, 2009

Related U.S. Application Data (60) Provisional application No. 61/121,307, filed on Dec. 10, 2008.

(51) Int. Cl.
*G01N 27/72* (2006.01)
*G01R 33/12* (2006.01)

(52) U.S. Cl. ........ 324/239; 324/260; 324/228; 324/234; 324/233; 324/204; 324/236; 324/237; 324/238; 324/240; 324/241; 323/355; 374/45

(58) Field of Classification Search .................. 324/223, 324/227, 260, 228, 234, 233, 204, 236–241; 323/355; 374/45
See application file for complete search history.

(56) References Cited

U.S. PATENT DOCUMENTS

| | | | | |
|---|---|---|---|---|
| 3,735,247 | A * | 5/1973 | Harker | 324/226 |
| 4,820,981 | A * | 4/1989 | Bussiere et al. | 324/222 |
| 5,008,621 | A * | 4/1991 | Jiles | 324/227 |
| 5,012,189 | A * | 4/1991 | Jiles | 324/209 |
| 5,015,102 | A * | 5/1991 | Yamaguchi | 374/107 |
| 5,394,083 | A * | 2/1995 | Jiles | 324/223 |
| 5,475,305 | A * | 12/1995 | Jiles et al. | 324/227 |
| 5,977,767 | A * | 11/1999 | Chaparala | 324/244 |
| 6,580,271 | B2 * | 6/2003 | Li et al. | 324/260 |
| 7,477,050 | B2 * | 1/2009 | Gambino et al. | 324/76.14 |
| 8,174,258 | B2 * | 5/2012 | Raykhman et al. | 324/228 |
| 2006/0226832 | A1 * | 10/2006 | Ikeda et al. | 324/204 |
| 2008/0054898 | A1 * | 3/2008 | Hausperger et al. | 324/260 |
| 2011/0037461 | A1 * | 2/2011 | Braun | 324/240 |

OTHER PUBLICATIONS

Jeremy M. Walker, "Measurement and Modeling of the Anhysteretic Magnetization of Magnetic Cores for Temperature and Frequency Dependent Effects", Dissertation, UMI No. 3306900, Jul. 20, 2007 (Copyright 2007).*

(Continued)

*Primary Examiner* — Patrick Assouad
*Assistant Examiner* — Lamarr Brown
(74) *Attorney, Agent, or Firm* — Andriy Lytvyn; Jeremy Spier; Smith & Hopen, P.A.

(57) ABSTRACT

An automated, non-destructive anhysteretic magnetization characterization method for studying and modeling soft magnetic materials. This measurement method employs a "reading-waveform" that allows multiple points of reference to be established in tracing out the B waveform. In using the reference values from this waveform, the components of B that cannot be measured directly may be calculated with precision. In turn, the initial magnitude of the B waveform is identified as the unknown component of the anhysteretic state. The processes can be repeated for different values of static fields as well as a function of temperature to produce a family of anhysteretic magnetization curves. The core characterization was performed without physically altering the core, so that the true anhysteretic magnetization curve, and the true B-H loop under applied bias H, is measured.

6 Claims, 10 Drawing Sheets

OTHER PUBLICATIONS

Haiso, "The Thermal, Magnetic, and Structural Characterization of the Crystallization Kinetics of Amorphous Soft Magnetic Materials", 2002 Magnetics Conference, Intermag Europe 2002, IEEE International Digest of Technical Papers, pp. Dec. 2002.*
Craik et al., "Anhysteretic Magnetization Processes", Journal od Applied Physics, vol. 30, 2, Feb. 1, 1963, pp. 871-872.*
Friedman, "Method for Characterization of Hysteresis in Two Dimensions", IEEE Transactions on Magnetics, vol. 36, Jan. 1, 2000, pp. 216-222.*
Tellini et al., "New Method to Characterize Magnetic Hysteresis in Soft Ferrites Up to High Frequencies", IEEE Transactions on Instrumentation and Measurement, vol. 55, Feb. 1, 2006, pp. 311-315.*
Chen et al., "Artificially Hardened Model of Soft Magnetic Materials and Its Application to Analysis of Magnetic Field", IEEE Transactions on Magnetics, vol. 30, Sep. 5, 1994, pp. 2940-2943.*
Azzouz et al., "How to Characterize Soft Magnetic Materials by Measuring Magnetic Flux Density in a Rotating Field Apparatus", IEEE Transactions on Magnetics, vol. 38, May 3, 2002, pp. 1477-1480.*
Bertotti, Hysteresis in Magnetism: for Physicists, Materials Scientists, and Engineers, 1998, Academic Press, San Diego, pp. 482-488.
Bozorth, Ferromagnetism, 1951, Princeton: Van Nostrand, pp. 8-9.
Buck et al., Automatic Hysteresisgraph Speeds Accurate Analysis of Soft Magnetic Materials, PCIM, 2000, pp. 1-5.
Lenz, A Review of Magnetic Sensors, Proceedings of the IEEE, 1990, vol. 78, No. 6, pp. 973-981.
Yu et al., Decay-Rate Dependence of Anhysteretic Remanence: Fundamental Origin and Paleomagnetic Applications, Journal of Geophysical Research, 2003, vol. 108, No. B12, pp. 1-10.
Wright, The Magnetization of Iron in the Absence of Hysteresis, The Physical Review, 1918, vol. XI, No. 3, pp. 161-169.
Hirasuna, Using Coupled Inductors and Inductor Cores, Cadence Design Systems, 2000, pp. 1-6.
Lederer et al., On the Parameter Identification and Application of the Jiles-Atherton Hysteresis Model for Numerical Modelling of Measured Characteristics, IEEE Transactions on Magnetics, 1999, vol. 35, No. 3, pp. 1211-1214.
Jiles et al., Ferromagnetic Hysteresis, IEEE Transactions on Magnetics, 1983, vol. Mag-19, No. 5, pp. 2183-2185.
Precision Magnetic Deflection, Cirrus Logic, Inc. 2009, pp. 1-4.
Ewing, Experimental Research in Magnetism, Philosophical Transactions of the Royal Society of London, 1885, vol. 176, pp. 523-640.
IEEE Standard for Test Procedures for Magnetic Cores, Institute of Electrical and Electronics Engineers, New York, New York, 1992.
Popovic et al., Hall-Effect Magnetic Sensors, In Magnetic Sensors and Magnetometers, P. Ripka, Ed., Boston: Artech House, 2001, pp. 180-184.
McLyman, Transformer and Inductor Design Handbook, New York: Marcel Dekker, Inc., 1978, vol. 277, pp. 16-17.
Jiles, et al., Numerical Determination of Hysteresis Parameters for the Modeling of Magnetic Properties Using the Theory of Ferromagnetic Hysteresis, IEEE Transactions on Magnetics, 1992, vol. 28, No. 1, pp. 27-35.
Jiles, Hysteresis Models: Non-Linear Magnetism on Length Scales From Atomistic to Macroscopic, Journal of Magnetism and Magnetic Materials, 2002, vol. 242-245, pp. 116-124.
Ramesh, et al., A Model of Anisotropic Anhysteretic Magnetization, IEEE Transactions on Magnetics, 1996, vol. 32, No. 5, pp. 4234-4236.
Fiorillo, Measurement and Characterization of Magnetic Materials, Academic Press, 2004, pp. 341-349.
Pearson, et al., Which Anhysteretic Magnetization Curve?, IEEE Transactions on Magnetics, 1997, vol. 33, No. 5, pp. 3970-3972.
Craik, et al., Magnetostatic and Exchange Interactions Between Particles in Permanent Magnet Materials, Brit J Appl Phys, 1969, Ser. 2, vol. 2, pp. 33-47.

\* cited by examiner

NONCONTACT ANHYSTERIC CURVE PLOTTER AND STATIC FIELD TO TIME-VARYING HYSTERESISGRAPH WITH INTEGRATED TEMPERATURE CHAMBER

CROSS REFERENCE TO RELATED APPLICATION

This application claims priority to U.S. Provisional Patent Application No. 61/121,307 by the same inventors, entitled "NONCONTACT ANHYSTERIC CURVE PLOTTER AND STATIC FIELD TO TIME-VARYING HYSTERESISGRAPH WITH INTEGRATED TEMPERATURE CHAMBER" filed Dec. 10, 2008.

STATEMENT OF GOVERNMENT INTEREST

This invention was made with Government support under Grant No. W911NF-04-2-0014 awarded by the United States Army Research, Development, and Engineering Command. The Government has certain rights in the invention.

BACKGROUND OF THE INVENTION

1. Field of the Invention

This invention relates to the measurement of real transformers and inductors, and provides a method of modeling a magnetic component.

2. Description of the Prior Art $M_{an}(H)$ is a single-valued function that represents the defect-free, or ideal, magnetization curve of a magnetic core and therefore it contains no hysteresis. A point on the $M_{an}(H)$ curve represents an anhysteretic state that is reached by demagnetizing the magnetic core sample under a constant magnitude of magnetic field. Each value of constant H yields a single value of B on the B-H plane once the demagnetization process is complete, where B and H are the magnitude of the magnetic flux density and the magnetic field, respectively. The material's magnetization may then be found from $$M(H) = \frac{B(H)}{\mu_0} - H \qquad \text{Equation (1)}$$

where, M(H) is the magnitude of the magnetization, and $\mu_0$ is the permeability of free space.

The anhysteretic magnetization curve finds one of its primary applications in the mathematical modeling of magnetic cores where the I-V terminal characteristics of a magnetic circuit component are predicted from a model of the M-H relationship. Many spice-based simulators implement a form of the Jiles-Atherton model where the present value of M is predicted as an offset from $M_{an}(H)$. Multiple models exist for $M_{an}(H)$ as it has been shown that the magnetic anisotropy and texture of a material are solely modeled by a modification of the $M_{an}(H)$ equation. If a proper model of $M_{an}(H)$ is not applied in the modeling process, significant errors occur in the prediction of the M-H relationship.

A proper model of the M-H relationship of a magnetic core requires an accurate model of $M_{an}(H)$. However, temperature based models of $M_{an}(H,T)$ are needed to accurately model the temperature behavior of a magnetic core. Even in the isotropic model of $M_{an}(H)$, the Boltzmann statistics do not accurately model the curve's temperature behavior.

The major difficulty in the measurement of $M_{an}(H,T)$ arises from measuring the resulting anhysteretic state, or rather where on the M-H plane forms a point after the demagnetization process. This difficulty arises as a fundamental result of Faraday's Law. No voltage is induced by the core as it rests in the anhysteretic state, or rather no voltage is induced as the magnitude of M does not vary with time. As a result, the voltage induced as the core is at rest in its anhysteretic state is zero.

Ideally, the core must be set in its proper state and followed by a measurement of that state. Measurement of B should proceed after the demagnetization process is complete to ensure that B has come to its final value and to avoid reading any induction caused by the demagnetizing waveform. Therefore, magnetic sensors would be ideal to measure an anhysteretic state of a commercial core because magnetic sensors can measure static B fields. For magnetic cores, this requires the core to be cut, and the sensor to be inserted into the gap of the core. It is well known that such an alteration to the core changes the M-H relationship. Therefore, the introduction of a gap or modification of the core geometry would invalidate the measurement of the resulting B of the original core.

The known problems of commercial magnetic sensors, such as limited temperature range, temperature dependent output, and constant offset nulling, also further complicate the utilization of a magnetic sensor in the measurement process.

In the prior art, the method to measure an anhysteretic state began with soft magnetic samples being subject to vibration as a method of demagnetization. The material is placed experimentally into an anhysteretic state by applying a slowly decreasing alternating waveform with an applied bias. The point-by-point (ballistic) method can be performed to measure quasi-static curves and the anhysteretic curve. However, the basic problem of resolving a point on the anhysteretic curve by measuring an induced voltage still remains extremely difficult because a component of the flux which can change at a constant rate will not induce a voltage as a result of Faraday's Law. In practice, the point-by-point method for measuring quasi-static magnetization curves often produces different measurement results than the preferred continuous recording methodology often employed in most modern commercial systems. Another method to measure $M_{an}(H)$ is that the measurement of an anhysteretic state can be performed by measuring the change in the magnitude of B up to its saturation limit, where saturation is therefore used as a reference point to identify the magnitude of B. Caution must be exercised in using saturation as a reference due to the known difference in technical and true saturation. The magnitude of B continually rises during saturation due to the difference between technical and true saturation. This can make the application of saturation as a reference point somewhat arbitrary. One must assume that the initial point of reference as to where B begins is zero, or rather that the core has been ideally demagnetized. Given the existence of anhysteretic remanence, this is highly unlikely.

In all of these methods, the details of how the static components of the B field are resolved are not given, and they are believed to be neglected. A constant rising or falling B with respect to time will not induce a voltage as a result of Faraday's Law. A B waveform that is maintained at a constant offset from zero will also not induce a voltage.

As discussed above, modern power conversion systems use components that exhibit very nonlinear behavior as a result of their magnetic field (B-H) characteristics.

Apparatuses of the prior art cannot measure the full B-H loop for a magnetic core under applied bias conditions. The various apparatuses also cannot measure static non-time varying B-fields, which are required to be measured when measuring the anhysteretic magnetization curve. This is a result of the fundamental measurement method relied on by these apparatuses.

There are two categories of equipment presently used. The first category uses a winding of wire around a magnetic core to measure the core's flux, and the second category uses a sensor. To use a sensor, a magnetic core must be cut and a sensor must be inserted inside the gap of the core. This changes the B-H properties of the core. The benefit of using a sensor is that it can sense a static or non-time varying B-field. Before this equipment was invented, a simple winding of wire around the core could not be used to measure a static or non-time varying B-field. This is the only presently known type of equipment that can measure the B-H relationship under applied bias as well as the true anhysteretic magnetization of a magnetic core, while avoiding cutting the core.

Further, the design of complex power conversion systems has been hampered by a lack of the ability to properly predict the terminal characteristics of magnetic components.

There is no method currently available to directly measure the complex magnetic core properties accurately enough to permit accurate device and system design.

SUMMARY OF THE INVENTION

The present invention applies a regular winding to measure the component of B that is responsible for the induced voltage. Such data was found to be ideal for modeling $M_{an}(H,T)$ and, therefore, the M-H behavior of magnetic cores as function of temperature.

The method of the present invention provides a complete approach to resolving both the linear rising or falling component of B as well as the offset component of the B waveform, where it must be noted that both of these components do not produce an induced voltage.

The present invention measures the two most fundamental relationships (curves) of these components, and allows the user to collect data that can be used to model a component and measure some basic properties of the magnetic material. The resulting models of the magnetic components aid in the design of power converters. The invention provides for an increase in the efficiency of power converters, an increase in the power density of power converters, and a lower overall system cost, and it also allows for future designs not yet realized.

The present invention may be used in the modeling of magnetic cores in circuit simulation software. The measurement capability of the present invention greatly enhances the accuracy of such software. Measurements made using the present invention can be used by the software to predict the B-H relationship. The present invention may also be used in the design of power converters or magnetic components, or software simulators for power converters.

The present invention could be very helpful to those designing power conversion systems.

The methodology employed in this system allows for the measurement of the true B-H relationship using a wire wound around the core. The equipment is also able to measure non-time varying, static B-fields.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The Jiles-Atherton model is used by simulation tools such as Orcad PSpice® to model the nonlinear I-V behavior of magnetic cores. This is accomplished by predicting the magnetization, M(H), as an offset of the ideal magnetization, $M_{an}(H)$, which is also referred to as the anhysteretic magnetization. Previous work has shown that significant error in the predicted B-H relationship will occur with an improper model for $M_{an}(H)$ as the magnetocrystalline anisotropy and texture of the material is solely modeled by the anhysteretic magnetization curve. $M_{an}(H)$ also represents the thermodynamic equilibrium of a magnetic core and a proper accounting of the temperature dependence of $M_{an}(H,T)$ is necessary to model the core's B-H relationship as a function of temperature.

The present invention includes a methodology implemented in an automated measurement system for plotting $M_{an}(H,T)$ of an arbitrary magnetic core. The method avoids altering the physical structure of the core by using a winding to measure the total magnetic flux. A point on the curve is then resolved after demagnetization by the application of a unique H waveform to read the total flux including the non-induced components. The M-H relationship remains unaltered, and the collected data is ideal for modeling the anhysteretic magnetization of a commercial magnetic core as a function of temperature.

Figure 1:
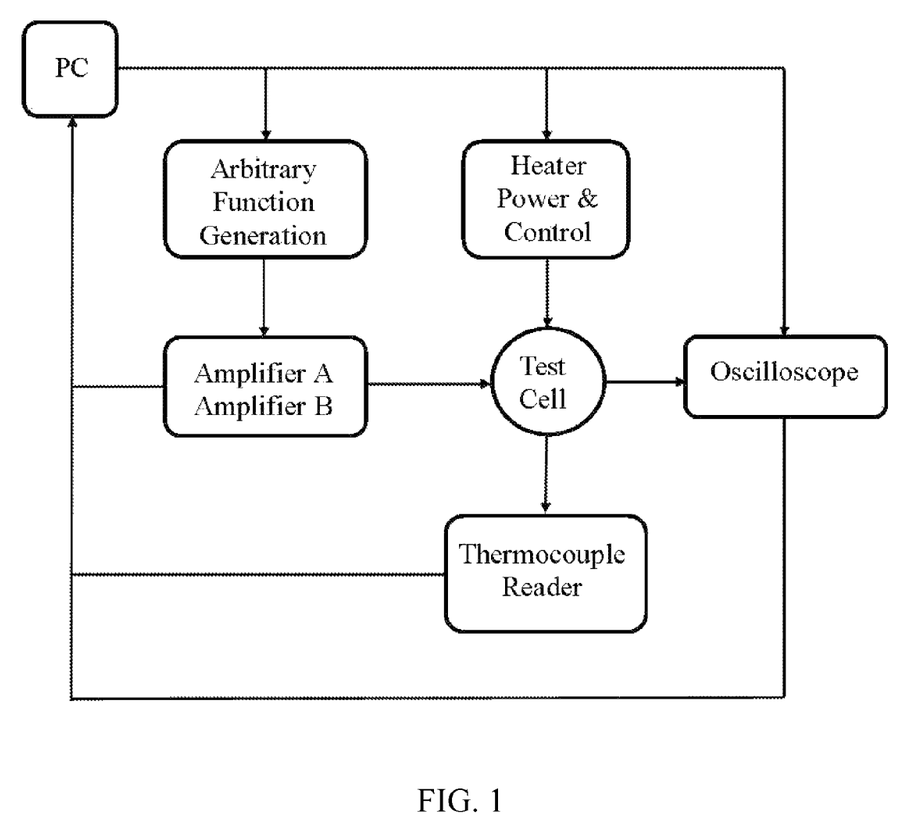
FIG. 1 is a block diagram of the characterization system of an embodiment of the present invention illustrating the major components.

In an embodiment of the present invention, the system, as shown in FIG. 1, comprises seven major components that are integrated together using National Instrument's LabVIEW™ programming language. The system utilizes a continuous recording technique like that of a hysteresis graph. However, unlike modern hysteresis graphs such as the Walker AMH-401, the system is capable of resolving both the induced and non-induced components of B due to multiple reference points being introduced by the applied field.

All of the system components, except the temperature-controlled test cell, precision magnetic-deflection amplifiers, and automated control program, are commercially available products that may be substituted. The arbitrary function generator and personal computer (PC) generate the AC and DC signals required in order to apply the magnetic fields. Sample temperature is maintained by a pair of embedded heating elements inside the test cell, and a thermocouple reader enables a PC-based control algorithm. Response and stimulus waveforms are captured by a digital oscilloscope and transferred to the PC for subsequent numerical analysis.

Figure 2:
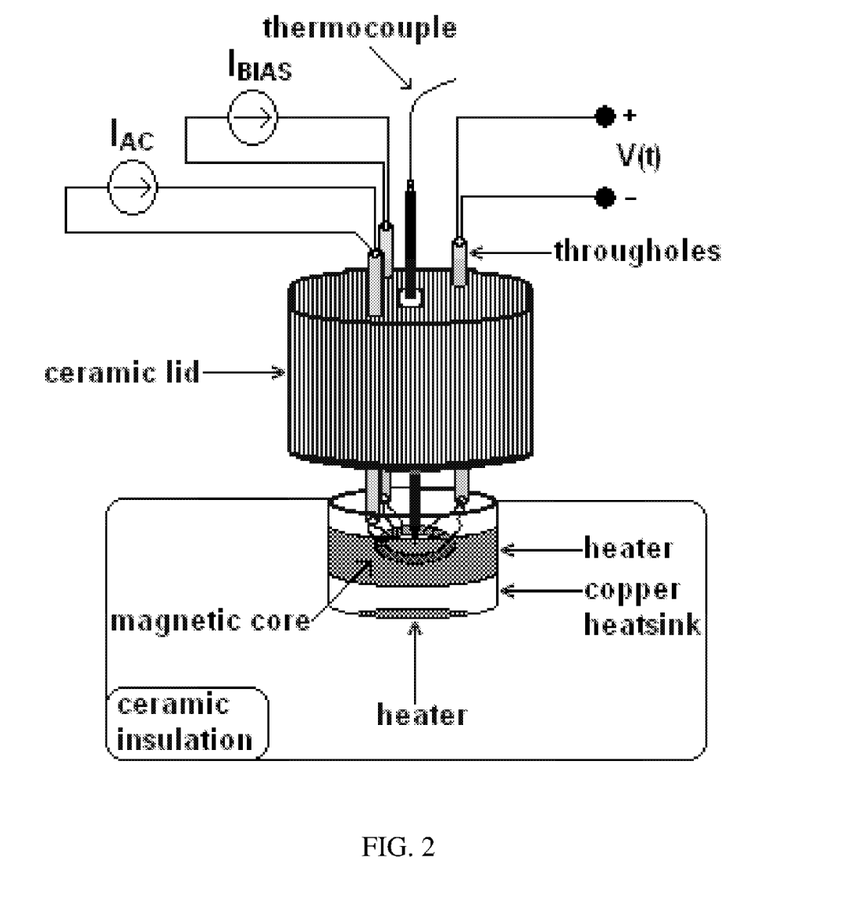
FIG. 2 is a test cell diagram illustrating the integrated heating elements and current sources connected to the toroidal core under test.

The custom test cell, shown in FIG. 2, is constructed of a closed copper cylinder that is uniformly heated along its perimeter and base by a rubber and metal foil heater. The copper cylinder behaves as a cylindrical heatsink that encloses the sample. Ceramic insulation surrounds the cylinder to permit the system to achieve thermal equilibrium. The core-under-test is suspended inside the cell by its windings and a T-type thermocouple is inserted via a feed-through approximately 2 mm above the core to monitor the ambient temperature inside the cell. After a temperature ramp, both the mean and median values of the temperatures are measured. Both comparisons must be within 0.001% of the measured target temperature for forty minutes before the control program allows a measurement to proceed. Temperature data is saved and plotted for each data point.

Figure 3:
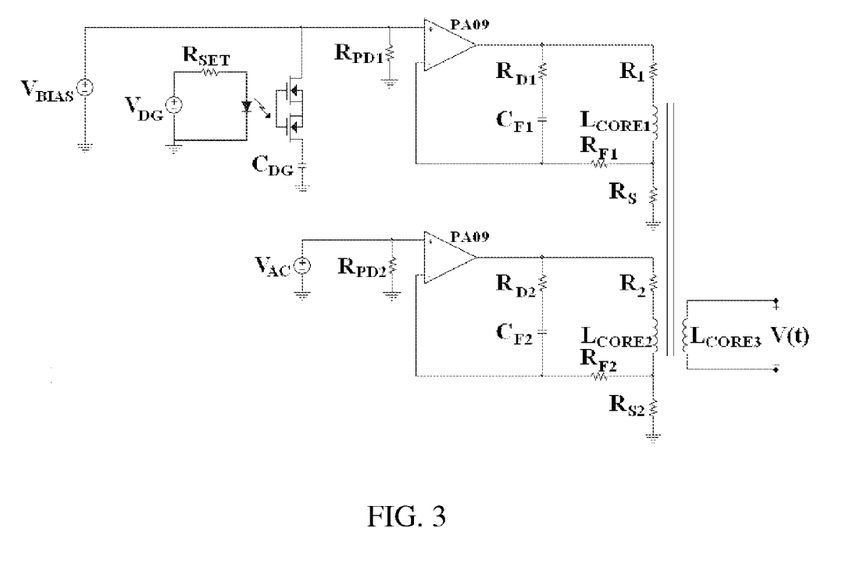
FIG. 3 is a simplified circuit diagram of the two current sources used to generate $I_{BIAS}$ and $I_{AC}$.

The current sources that excite the coils to produce the magnetic fields are implemented by a pair of high-speed, high-slew rate operational-amplifiers. One current source, $I_{BIAS}$, maintains a DC current through one winding in order to establish the constant H-field. Another current source, $I_{AC}$, provides the AC excitation through a second winding. The $I_{AC}$ current source is used to demagnetize the core and excite the core after the demagnetization process is complete to measure $B_{Dc}$. The current sources for this system were designed using the Apex Microtechnology PA09 Video Power Operational Amplifier. Both current sources provide an extremely high output resistance, so that an induced voltage will not alter the regulation of the bias current. FIG. 3 shows the simplified schematic of the current sources.

The selection of the number of turns required will determine a number of factors. The inductance of the core-under-test will change, and this must be compensated for in the design of the magnetic-deflection amplifiers. Not only will the inductance of the core change as a function of the excitation frequency, but also as a function of temperature. The magnetic-deflection amplifiers must be able to provide excitation to the core through a range of inductance values as the core is heated. Finally, the magnitude and frequency of the demagnetization waveform must, as a minimum, meet IEEE and ANSI standards.

Systems that use voltage excitation in producing magnetic fields must exercise caution in ensuring that the currents are properly applied and regulated. While it seems logical to use a programmable power supply or potentiometer to adjust the bias current from a regulated voltage source, during AC excitation the bias winding will have an induced voltage present. If the regulation of the bias current is changed, the magnetized state of the core changes. The measurement would then be invalid. Extreme care should be exercised when attempting to properly regulate the bias current with a voltage supply.

In contrast to the aforementioned difficulties in measuring the anhysteretic magnetization curve, the present method excites the core after the demagnetization process with a continuous waveform that establishes several reference points in the resulting B waveform. These reference points allow for the resolution of the static components of the B field as well as a reference to zero B. The general procedure to set an anhysteretic state is outlined below, followed by details of how that state is identified from the induced voltage. A general flowchart describing the measurement process is show in FIG. 4.

Figure 4:
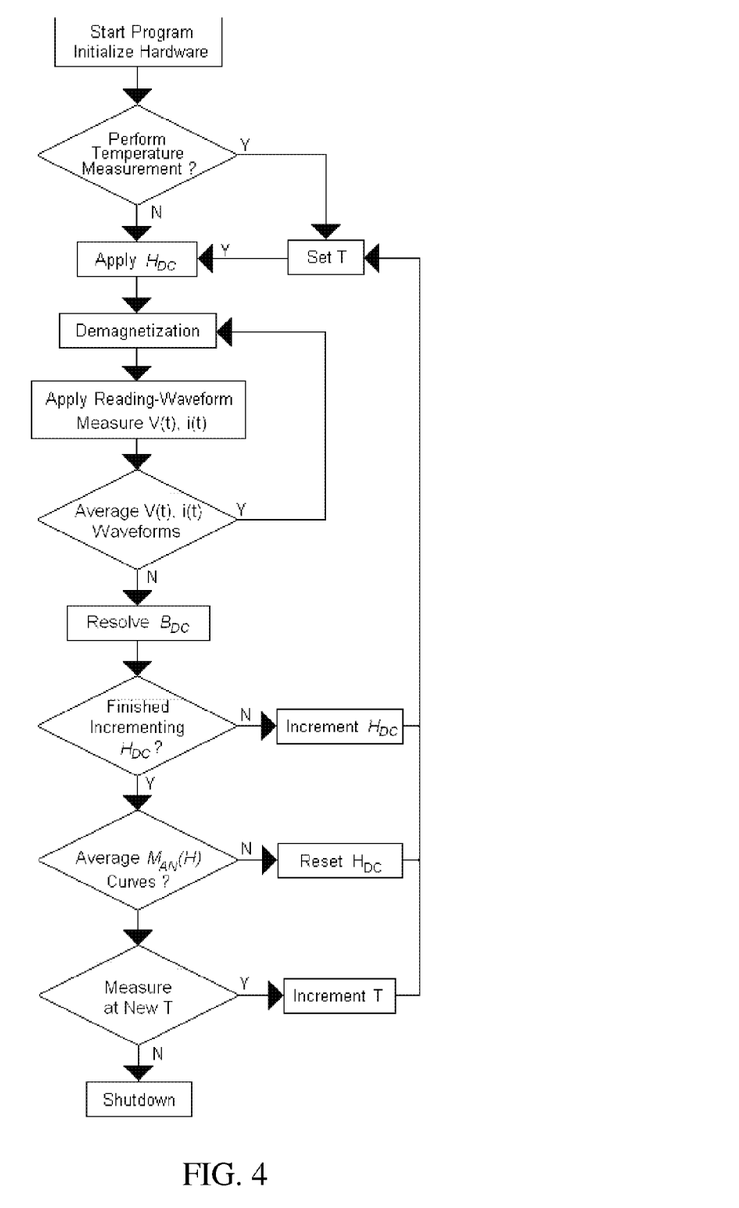
FIG. 4 is a simplified flowchart showing the general automated procedure to measure the anhysteretic magnetization curve.

After instrument initialization, the measurement process begins with setting of the sample's temperature. Once the sample's temperature is stabilized, $H_{DC}$ is applied via the winding connected to the $I_{BIAS}$ current source. The demagnetization process is then initiated. The system generates a continuous decaying sinusoidal current to demagnetize the core. Discrete steps created from the digitization of the demagnetizing waveform are filtered by a large ceramic capacitor at the input of the AC current source. This capacitor is enabled only during the demagnetization process by a photo-voltaic relay.

For the data presented here, the core is demagnetized two times with five hundred cycles until the demagnetizing waveform decays to zero. The magnitude of the demagnetizing waveform begins at 889 A/m and decays by 2% for each cycle at a 50 Hz rate. Demagnetization occurs before every measurement to place the core in the same state. Once the core is demagnetized for a given value of $H_{DC}$, it is in a proper state to be measured. The core is then excited with a total H field ($H_{AC}+H_{DC}$) that traces out a B-H loop with the negative and positive magnitudes of H being equal. The purpose of applying equal magnitudes in the positive and negative directions to H is to cause B to saturate equally in both directions such that $|+B_{sat}|=|-B_{sat}|$. In this way, the measured saturation values of the B waveform can be used as reference points because they are equal.

Figure 5:
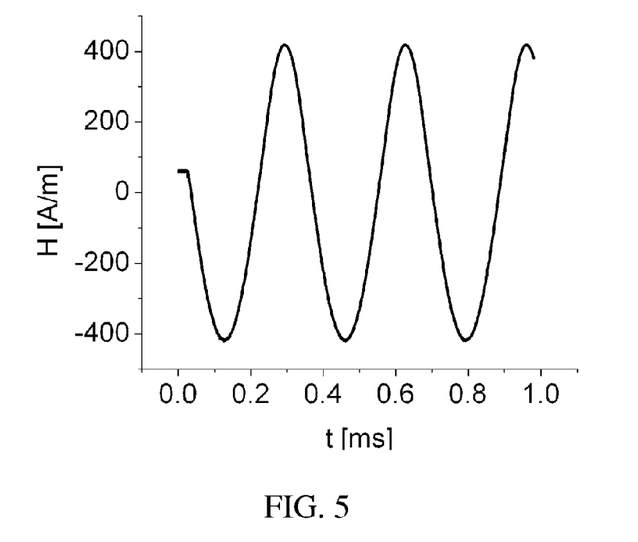
FIG. 5 is a graph showing the total H created by $I_{AC}+I_{BIAS}$.

Herein, the applied H waveform is referred to as the reading-waveform. Its purpose is to establish points of reference from which the static components of B can be properly identified, and the value of zero B can be properly identified. This also overcomes the challenge of using a single saturation point as a reference, which again can become arbitrary due to the difference in true and technical saturation. In order to accomplish a correct reference value $I_{BIAS}+I_{AC}$ must cause the total applied H field to have equal magnitudes in the positive and negative directions while still maintaining a constant, average value of $H_{DC}$, as shown in FIG. 5.

Figure 6:
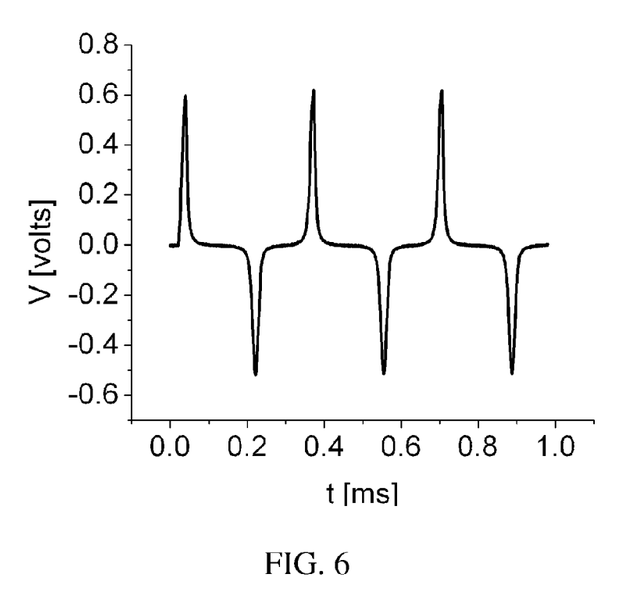
FIG. 6 is a graph showing the induced, secondary voltage generated by the reading-waveform.

The reading-waveform causes a voltage, V(t), to be induced that will identify $B_{DC}$ after it has been processed. The induced voltage is measured from the third winding and captured by a Tektronix TDS 2014 Digital Storage Oscilloscope. Each channel on the oscilloscope is programmed to capture either a positive or negative portion of either the voltage or current waveform, and each channel has been programmed to automatically readjust its scale after an initial measurement. The measured voltage is shown in FIG. 6.

Once V(t) is measured, it is passed to the digital integrator that is implemented in the Labview control program. Before integration, the mean value of the induced voltage is numerically calculated and subtracted from the entire voltage as no mean value can be induced. The time-varying flux density is found by numerical integration according to Faraday's Law. The result of this integration is shown in FIG. 7.

Figure 7:
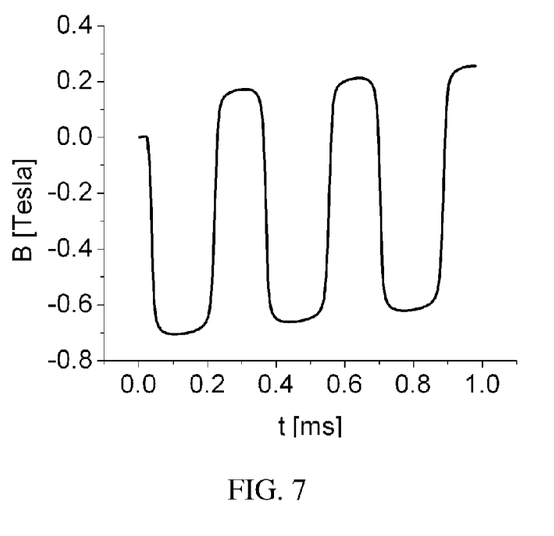
FIG. 7 is a graph of a B-field waveform resulting from direct integration of the induced voltage.

From FIG. 7, the two static B field components must be indirectly calculated based upon the reference points of the reading-waveform. These reference points are the maximum and minimum of the time-varying B field waveform which can be properly identified as positive and negative saturation as evidenced by the fact that they are saturated. The total B field waveform will be composed of three parts. The first component is the nonlinear, time-varying component that was found by direct integration of the voltage according to Faraday's Law as shown in FIG. 7. The second component is the constant rising or falling component of the B field with respect to time, and it is not induced. The third static component is a constant offset of B from the zero B axis. Each of these component magnitudes are resolved separately.

To calculate the first component of the static flux density, the component of B that occurs due to a linear rise or fall with respect to time must be identified. Numerically, a constant rate of change in B with respect to time would be represented by a constant voltage in the induced voltage waveform and no such voltage can be induced. The component of B that is changing at a constant rate will then appear to be numerically subtracted from the measured B field waveform that was found by direct numerical integration. In doing so, the total flux density experiences a linear rise with respect to time, as shown in FIG. 7. For a typical unbiased B-H loop measurement, this linear rise in B with respect to time is not observed as there is no constant change in B with respect to time. However, the constant change component can be identified iteratively from the measured B waveform by adding the DC voltage, $DC_{INT}$, inside the voltage integral.

Figure 8:
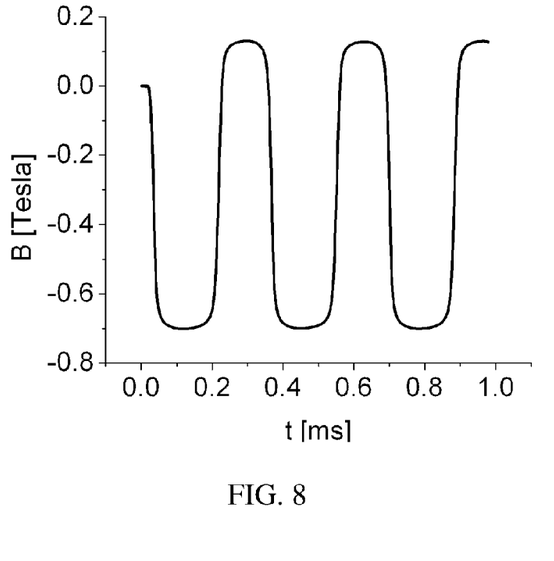
FIG. 8 is a graph of a B-field waveform resulting from resolution of the first non-induced component.

When $DC_{INT}$ is added to the voltage integral, the positive and negative saturation limits will all have the same magnitude. This $DC_{INT}$ can be calculated by performing a least squares fit on the peaks and valleys of the B field waveform. The value of $DC_{INT}$ can be incremented until the value of the slopes of the lines across the peaks and valleys becomes zero. Once the slopes of the lines across the B field peaks and valleys are zero, the iteration of $DC_{INT}$ can halt. The magnitudes of saturation are all equal at this point as expected for a symmetrical H field excitation. The first component of the static B field has been resolved. The constant change in B from the initial to final value of B can now be observed.

Now that that the constant change component of the B field has been identified, the adjusted B field waveform can be used to properly identify the anhysteretic state. It can be said with certainty that the value of zero B is at the midpoint between equal saturation limits. This is a result of applying a magnetic field with equal positive and negative magnitudes, which in turn causes the magnitude of B to be equal in both the positive and negative directions. Each midpoint between the peaks and valleys of B can be identified as zero, so that a number of reference points to zero B can be made. If the reading waveform did not apply a magnetic field with equal magnitude in the positive and negative direction, the value of zero B could not be identified with certainty.

Figure 9:
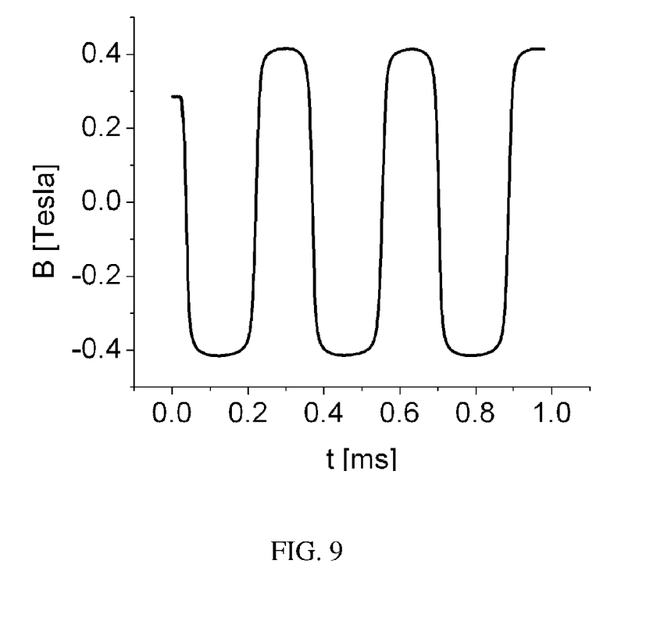
FIG. 9 is a graph of a B-field waveform resulting from $B_{DC}$ being properly identified after the demagnetization process.

This midpoint is calculated, and the measurement of the total B waveform is completed by shifting the entire waveform so that the midpoint corresponds to zero B. This constant offset component was not induced, and it is the second non-induced component of the field. With all components of the B waveform resolved, the initial value of the waveform is identified as $B_{DC}$ as a result of the core being placed in the anhysteretic state. The total B waveform is shown in FIG. 9, where it can be observed that saturation now occurs at the same magnitude of B in both the positive and negative directions. Clearly, if the reading-waveform does not have equal magnitude in the positive and negative direction, then identification of the DC components of the waveform is not possible. The reading-waveform provides points of reference in the B waveform for which the static components of the field can be calculated as well as the value of zero B. This is done by applying a magnetic field due to $I_{AC}+I_{BIAS}$ with the same magnitude. This enables the reading of $B_{DC}$ after resolving the two DC offsets.

Figure 10:
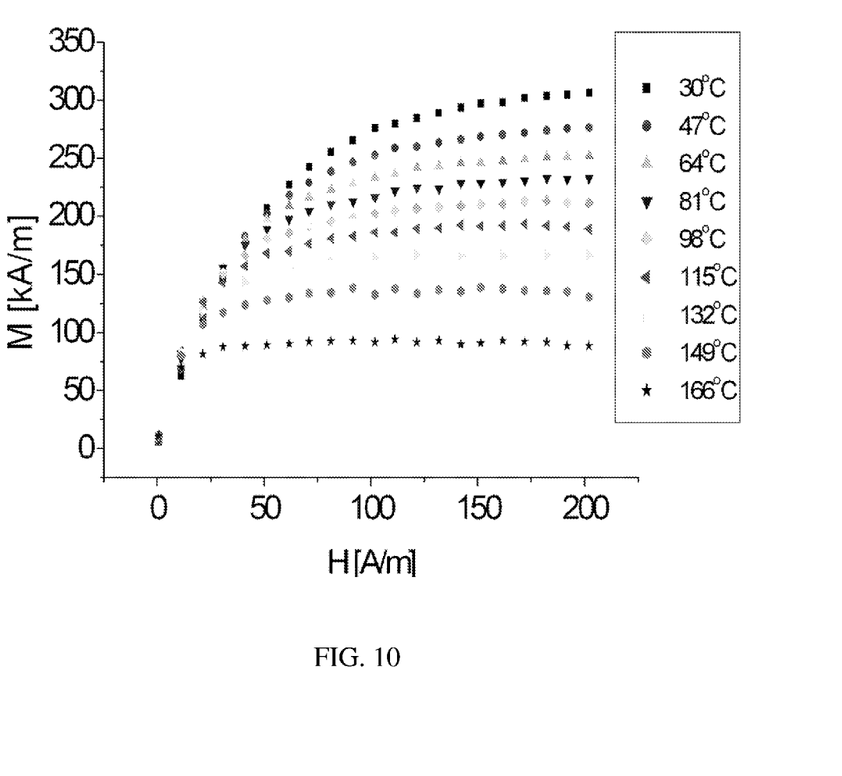
FIG. 10 is plot of a family of anhysteretic magnetization curves measured as a function of core temperature using a Magnetics Inc.'s F-type ferrite core #0F-40401-TC.

Once $H_{DC}$ and $B_{DC}$ are found, the value of $M_{DC}$ can be determined using Equation (1). Thus, a single point on the anhysteretic magnetization curve is now known. Once a single point is measured, the measurement may be repeated and averaged to increase accuracy. Signal averaging can also be performed to increase accuracy along with using multiple peaks and valleys. Before each point is measured, the core undergoes the same demagnetization process with the same value of $H_{DC}$. In this way, the core is placed in the same state. The process then repeats for every point on the plot. The temperature is then incremented and the family of curves for the anhysteretic magnetization is plotted as shown in FIG. 10.

While a strong argument can be made that symmetrical excitation of H provides for equal magnitudes of B in the positive and negative direction and that the static components of the field can be resolved by properly identifying the saturation points in the B waveform, some numerical or mathematical proof should be demonstrated to ensure that the steps and methodology applied are correct.

Figure 11:
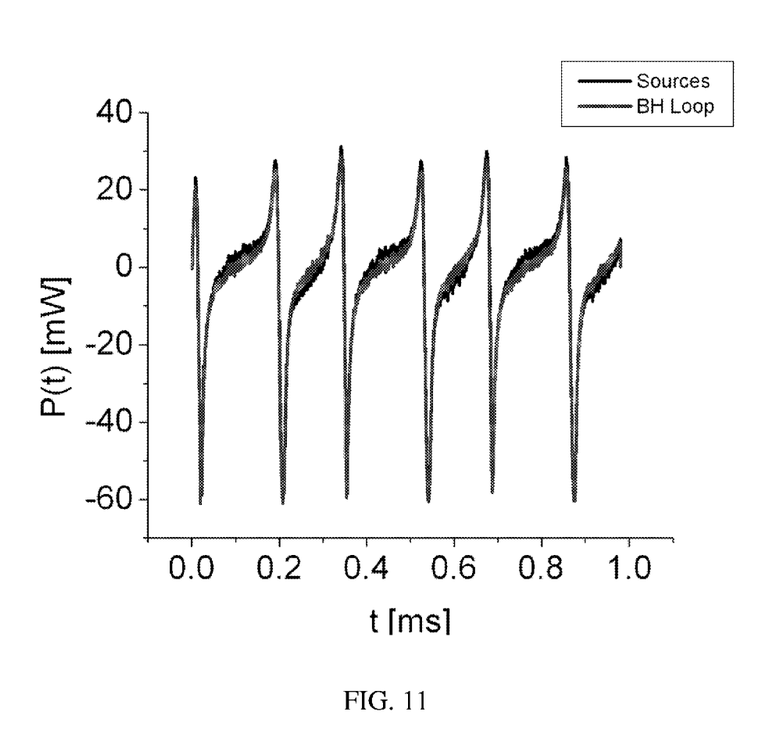
FIG. 11 is a plot of the power delivered to the core.
Figure 12:
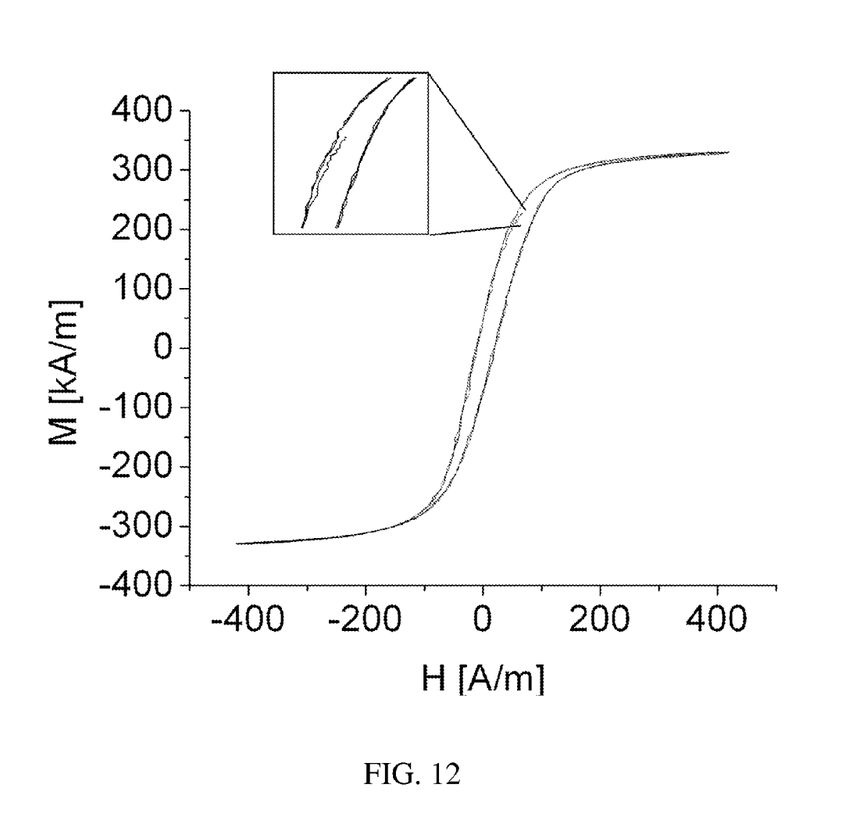
FIG. 12 is a graph of a M-H loop being traced out starting from the anhysteretic state.

Such a proof can be accomplished with an examination of the power delivered by both current sources and the power measured from the total B-H loop. It is well known that the total power delivered to the magnetic system is proportional to the overall hysteresis loop, and that the power must be conserved. The energy supplied by the external sources and imparted to the field is given by the well known equation $$E = V\int_0^{B_p} H dB = \int_0^{\tau_o} H(t)\frac{dB}{dt}dt \qquad \text{Equation (2)}$$

where V is the volume of the core. Resistive losses that would subtract from the overall power being delivered to the magnetic system have been made negligible in the data presented here by using only two windings for each current source. The total power measured from the magnetic system is then given by $$P(t) = Al_e H(t)\frac{dB}{dt} \qquad \text{Equation (3)}$$

where A is the area of the core and $l_e$ is the magnetic path length. A comparison between the power imparted by the current sources and the power measured from the B and H fields shows negligible differences, as demonstrated in FIG. 11. FIG. 12 shows that the final M-H loop with the magnetization curve being traced from the anhysteretic state along with increased area in the first quadrant. This confirms that the total loop area of the M-H loop does become larger under an applied H bias. The measured narrowing of the loop with increased applied bias power would be the result of not measuring the static components of the field. Therefore, the results presented here appear to be in complete agreement with theory.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween. Now that the invention has been described,

What is claimed is:

1. An automated, non-destructive anhysteretic magnetization characterization method for studying and modeling soft magnetic materials, comprising the steps of:

loading a sample into a system chamber;
initializing equipment and measurement variables;
setting a temperature of said sample;
setting a magnetic state of said sample to enable a point on an anhysteretic magnetization curve to be measured;
measuring a resulting anhysteretic state of said sample;
incrementing the value of a static field, $H_{DC}$, to measure a subsequent point on said anhysteretic magnetization curve; and
incrementing said temperature once the entire anhysteretic magnetization curve is measured.

2. The method of claim 1, further comprising the steps of:
applying a static (non-time varying) field, $H_{DC}$, to said sample; and
applying a demagnetizing waveform, $H_{DMAG}$, to said sample while maintaining said static field, $H_{DC}$, to set and hold said anhysteretic state of said sample to enable a point on an anhysteretic magnetization curve to be measured.

3. The method of claim 1, further comprising the steps of:
measuring said resulting anhysteretic state of said sample by applying a reading waveform; and
processing said measured reading waveform to extract a point on the anhysteretic magnetization curve.

4. The method of claim 3, further comprising the steps of:
applying a sum of $H_{AC}+H_{DC}$ to said sample with said $H_{AC}$ portion causing the magnitude of H to be driven equally in the positive and negative direction; and
said reading waveform transverses H in equal but opposite magnitudes measuring several references to zero B field.

5. The method of claim 3, further comprising the step of:
processing said measured waveform to extract a point on the anhysteretic magnetization curve by performing iterative integration with a constant until the magnitudes of the peaks and valleys of a measured B-waveform are aligned.

6. The method of claim 5, further comprising the steps of:
plotting said aligned B-waveform with said sum of $H_{AC}+H_{DC}$ to from a hysteresis plot comprising of static and non-time-varying fields; and
identifying said anhysteretic state components as composed of said $H_{DC}$ and initial state of said aligned B waveform.

* * * * *